United States Patent
Duclos et al.

(10) Patent No.: US 8,006,641 B2
(45) Date of Patent: Aug. 30, 2011

(54) INSTALLATION FOR DEPOSITING, BY MEANS OF A MICROWAVE PLASMA, AN INTERNAL BARRIER COATING IN THERMOPLASTIC CONTAINERS

(75) Inventors: Yves Alban Duclos, Octeville sur Mer (FR); Damien Cirette, Octeville sur Mer (FR)

(73) Assignee: Sidel Participations, Octeville-sur-Mer (FR)

( * ) Notice: Subject to any disclaimer, the term of this patent is extended or adjusted under 35 U.S.C. 154(b) by 884 days.

(21) Appl. No.: 11/869,902

(22) Filed: Oct. 10, 2007

(65) Prior Publication Data

US 2008/0087221 A1   Apr. 17, 2008

(30) Foreign Application Priority Data

Oct. 11, 2006 (FR) ...................... 06 08915

(51) Int. Cl.
*C23C 16/00* (2006.01)
*C23F 1/00* (2006.01)
*H01L 21/306* (2006.01)
*B05D 7/22* (2006.01)

(52) U.S. Cl. .......... 118/723 MW; 156/345.41; 427/230; 427/569; 427/575

(58) Field of Classification Search .......... 118/723 MW, 118/55, 214, 254, 622; 156/345.41; 427/230, 427/237, 238, 575

See application file for complete search history.

(56) References Cited

U.S. PATENT DOCUMENTS

| | | | |
|---|---|---|---|
| 6,849,126 B2 * | 2/2005 | Moore et al. | 118/254 |
| 2005/0223988 A1 * | 10/2005 | Behle et al. | 118/719 |
| 2006/0150909 A1 * | 7/2006 | Behle et al. | 118/719 |
| 2008/0035613 A1 * | 2/2008 | Duclos | 219/121.47 |

FOREIGN PATENT DOCUMENTS

| | | | |
|---|---|---|---|
| EP | 0 778 089 A1 | | 6/1997 |
| FR | 2 847 912 A1 | | 4/2004 |
| FR | 2 871 813 A1 | | 12/2005 |
| FR | 2 872 148 A1 | | 12/2005 |
| FR | 2 872 555 A1 | | 1/2006 |
| JP | EP1516941 | * | 3/2005 |
| WO | WO 99/17334 A1 | | 4/1999 |
| WO | WO 03/100115 A1 | | 12/2003 |
| WO | WO03100121 | * | 12/2003 |

* cited by examiner

*Primary Examiner* — Parviz Hassanzadeh
*Assistant Examiner* — Rakesh Dhingra
(74) *Attorney, Agent, or Firm* — Sughrue Mion, PLLC

(57) ABSTRACT

Installation for depositing, by means of a microwave plasma, a barrier coating on thermoplastic containers (5), this installation comprising treatment stations (1) each comprising a treatment enclosure (2) and a cover (3) and including a vacuum pumping chamber in which connection means (4) for sealed connection to the container comprise a sleeve (6) co-axial with the neck (7) of the container, each cover (3) also supporting an injector (8) co-axial with the sleeve (6) for injecting a reactive fluid into the container; the sleeves (6) and/or the injectors (8), of several adjacent stations are fastened to a single support plate (15, 20) that extends in the form of a bridge over the covers (3) of these stations (1), whereby the plate (15, 20) and the sleeves and/or injectors of the stations (1) constitute a unitary assembly (16, 21) that can be maneuvered as one piece.

14 Claims, 3 Drawing Sheets

INSTALLATION FOR DEPOSITING, BY MEANS OF A MICROWAVE PLASMA, AN INTERNAL BARRIER COATING IN THERMOPLASTIC CONTAINERS

FIELD OF THE INVENTION

The present invention relates in general to the field of the manufacture of thermoplastic, especially PET, containers, the wall of which is provided with an internal layer of a barrier coating, for example made of carbon, silica or other compound, suitable for preventing or slowing the exchange of molecules or ions through the wall.

The invention relates more specifically to improvements made to an installation for depositing, by means of a microwave plasma, a barrier coating on the internal surface of containers made of a thermoplastic such as PET, this installation comprising a multiplicity of container treatment stations each comprising a treatment enclosure and an upper block forming a cover and including a vacuum pumping chamber in which connection means for sealed connection to the container comprise a sleeve of tubular general shape co-axial with the neck of the container, each cover also supporting an injector co-axial with said sleeve and suitable for injecting a reactive fluid into the container during the treatment.

BACKGROUND OF THE INVENTION

An installation of the type in question is described and illustrated in document FR 2 872 148.

During the treatment of the container, a microwave field is emitted inside the enclosure and this field develops into the pumping chamber through the sleeve. The microwaves that propagate inside the sleeve and inside the pumping chamber cause particles of the barrier material (carbon, silica or other compound) to form deposits therein, which contaminate the internal walls of the sleeve and the pumping chamber, or even the internal walls of the pumping circuit. Deposits form in the same way on the external wall of the injector that is dipped into the container.

For this reason, it is necessary for the sleeve and the injector, and also the pumping chamber, to be cleaned frequently. To do this, the sleeve and the injector have to be individually dismantled. Document FR 2 872 148 shows an arrangement that allows the sleeve to be fitted onto the enclosure and to be removed therefrom.

These operations are lengthy, have to be repeated as many times as the installation has treatment stations, and require the installation to be immobilized, which is expensive.

Moreover, the operators of these installations require ever higher production rates. An increase in manufacturing rate may admittedly be achieved by improvements made in certain places in the design of the various parts or constituent components of the installation. However, to obtain a satisfactory result, the time to execute the process of depositing the layer of barrier material cannot be shortened sufficiently in order to result in a significant increase in the production rate of the installation, which seems, in the current state of the art, to be able to be obtained only by significantly increasing the number of treatment stations of the installation. It follows that the problem associated with the constraints caused by having to clean the sleeves, the injectors and the pumping chamber, then becomes even more acute.

SUMMARY OF THE INVENTION

The object of the invention is essentially to propose an improved technical solution to the abovementioned problem, so as to meet as satisfactorily as possible the expectations of the operators of the installations in question.

For this purpose, the invention proposes an installation as recited in the preamble, which is characterized in that members, chosen from among the sleeves and the injectors, of several adjacent stations forming a group of stations are fastened to a single support plate that extends in the form of a bridge over the covers of said stations.

Thanks to this arrangement, the plate and the members of said stations of the group of stations that said plate supports constitute a unitary assembly that can be maneuvered as one piece, thereby allowing faster handling in order to fit said members onto the respective covers or to remove them therefrom. The time during which the installation is immobilized for the purpose of replacing the members in question may thus be considerably shortened, even when the installation comprises a substantially greater number of treatment stations.

In one possible embodiment of the invention, said members are sleeves and the sleeves of said adjacent stations of the group of stations are fastened to a single sleeve-carrying plate that extends as a bridge over the covers of said stations.

In another possible embodiment, the members are injectors and the injectors of several adjacent stations of the group of stations are fastened to a single injector-carrying plate that extends as a bridge over the covers of said stations.

However, in a preferred embodiment, the sleeves of several adjacent stations of the group of stations are fastened to a single sleeve-carrying plate that extends as a bridge over the covers of said stations, the injectors of several adjacent stations of the group of stations are fastened to a single injector-carrying plate that extends as a bridge above the covers of said stations, and the injector-carrying plate is located on top of the sleeve-carrying plate. Thus, it is the assembly comprising the sleeves and the injectors of a group of stations that can be manipulated in blocks.

Again in a preferred embodiment, provision is made for each plate to include, in its central part, a gripping means suitable for maneuvering the unitary assembly in question. In particular, it may be advantageous for the sleeve-carrying plate and the injector-carrying plate, in their respective central parts, to be mutually offset in transversally opposed directions and for the respective gripping means to be located side by side. This arrangement makes it possible to envisage handling the assemblies automatically, but possibly individually, using a robot so as to increase the speed of intervention.

By constantly bearing in mind the speed of manoeuvre and the automation of the fitting/removal operations, it is useful for each unitary assembly formed by a plate and the sleeves or injectors that it supports to be designed for automatically establishing fluidic and/or electrical connections with the associated covers.

To avoid damaging the equipment during fitting and removal operations, it is desirable for each plate to be provided with at least one guiding finger which is substantially parallel to the axes of the members supported by said plate and which is received in the element (the cover or the sleeve-carrying plate, respectively) subjacent to said plate (the sleeve-carrying plate or the injector-carrying plate respectively). In particular, in the case in which use is made of both a sleeve-carrying plate and an injector-carrying plate, provision is then made for the sleeve-carrying plate to be provided with at least one through-passage suitable for the at least one guiding finger of the injector-carrying plate located above to pass through it.

In one actual embodiment, the treatment stations are distributed in groups comprising several adjacent stations and each plate supports several members belonging to the respective adjacent stations of a group of stations. In practice, the installation comprises an even number of stations, each group of stations comprises two adjacent stations and each plate supports two members belonging to two adjacent stations of a group of stations. In this case, it is desirable, for the sake of structural simplification, for the enclosures of the two adjacent stations of a group of stations to be brought together and juxtaposed.

The features according to the invention are easier to employ in an installation in which, for each station, the upper block forming the cover is stationary and fastened to the respective enclosure, and the bottom of the enclosure can move axially in order to permit the insertion and extraction of the containers, placed neck up, via the base of the enclosure.

The features according to the invention should be most particularly applicable in installations of the rotating carousel type, including a rotary frame that supports said multiplicity of stations distributed on the perimeter thereof.

BRIEF DESCRIPTION OF THE DRAWINGS

The invention will be more clearly understood on reading the following detailed description of certain preferred embodiments given solely by way of non-limiting examples. In this description, reference is made to the appended drawings, in which.

DETAILED DESCRIPTION OF THE INVENTION

Figure 1:
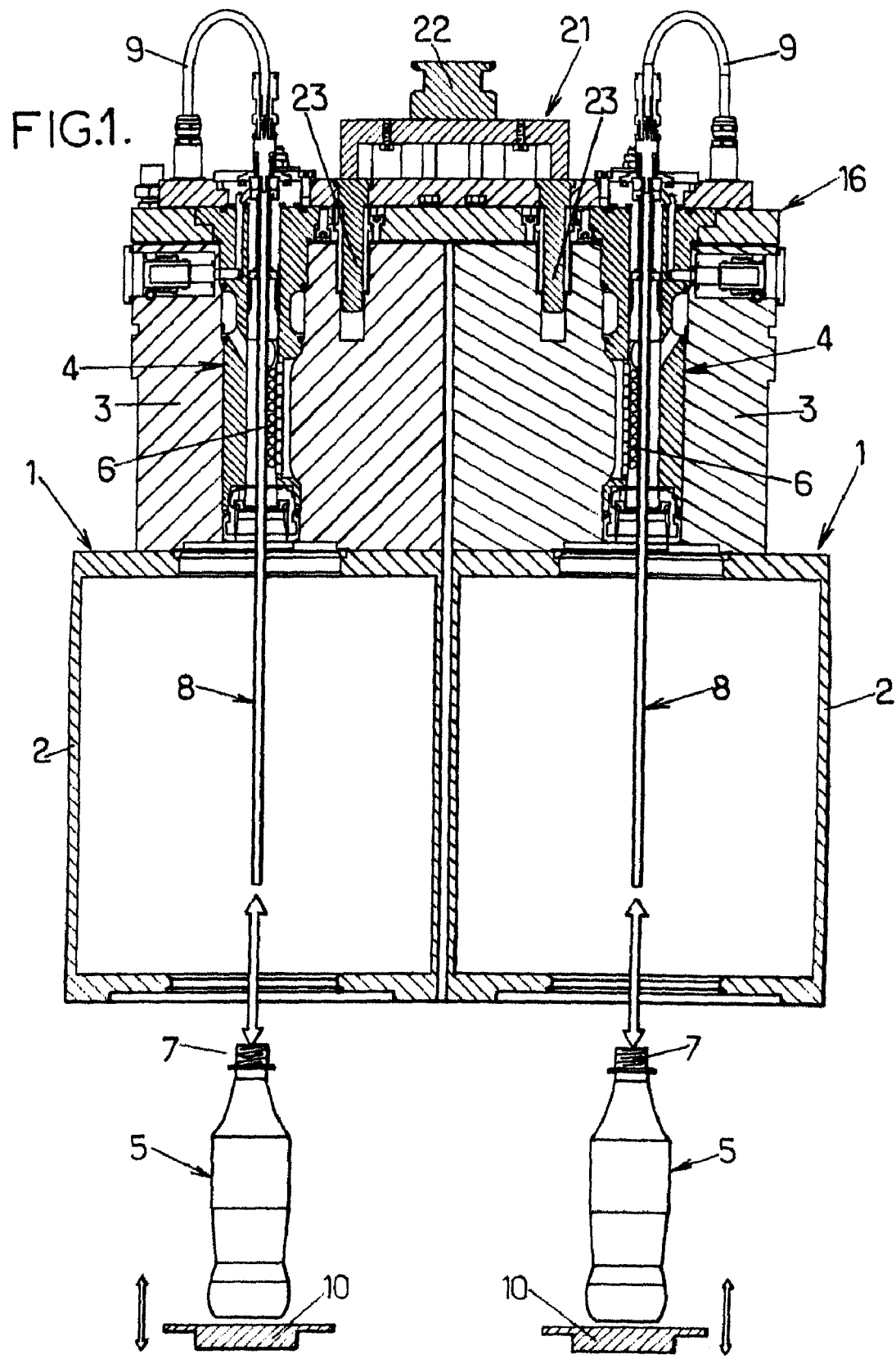
FIG. 1 is a sectional front view of part of a preferred embodiment of an installation designed in accordance with the invention for depositing, by means of a microwave plasma, a barrier coating on the internal surface of thermoplastic containers.
Figure 2:
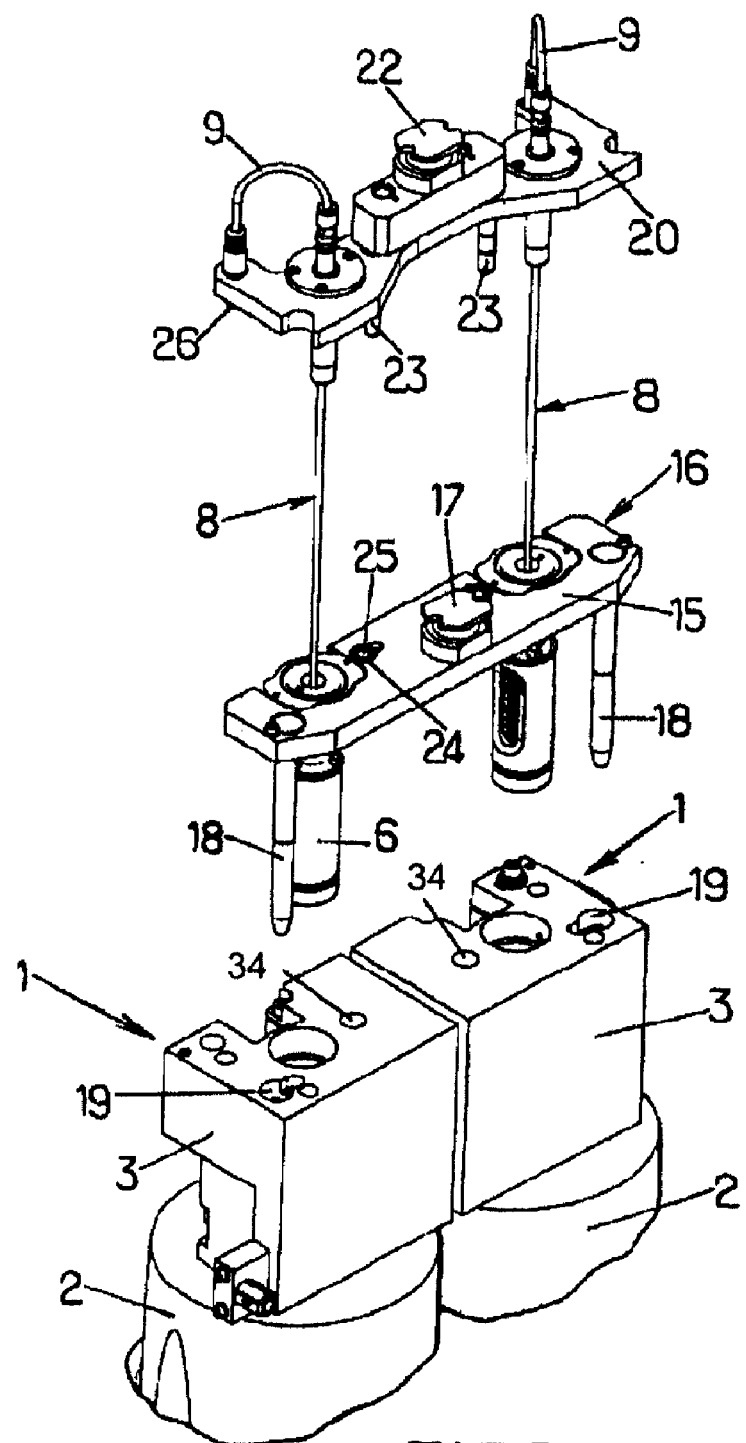
FIG. 2 is an exploded external view of part of the installation shown in FIG. 1.
Figure 3:
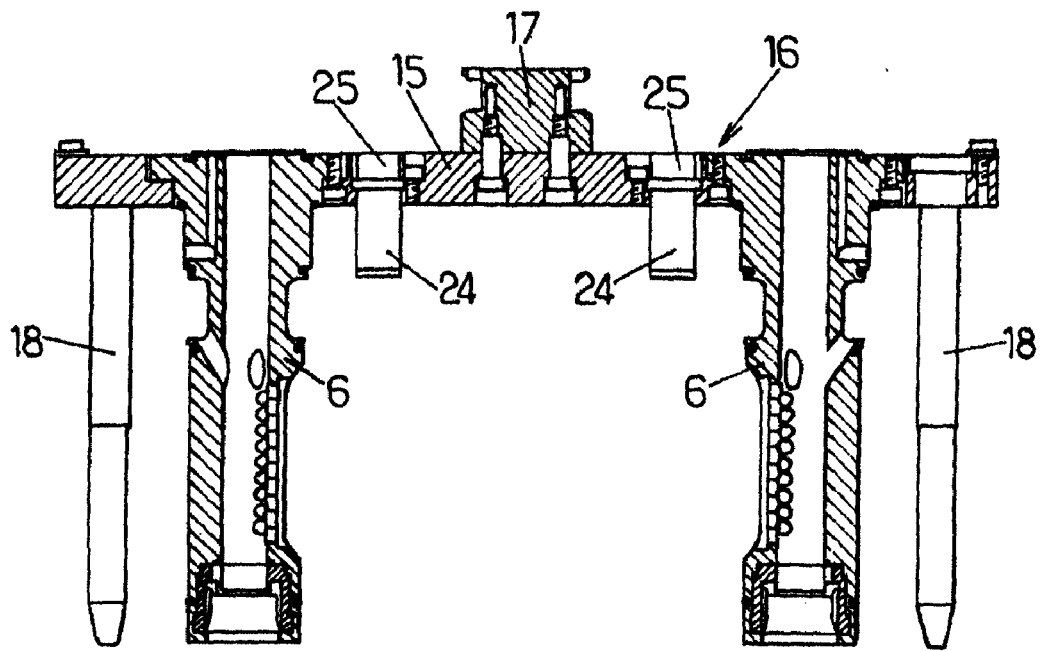
FIGS. 3 and 4 are sectional views of two components of the installation of FIGS. 1 and 2 designed in accordance with the invention.

Reference is now provided to FIGS. 1 to 3, in which is shown one part of an installation for depositing, by means of a microwave plasma, a barrier coating on the internal surface of containers made of a thermoplastic such as PET, this installation comprising a multiplicity of stations for the generally individual treatment of the containers. In practice, in an industrial installation intended for treating containers at a high rate, such an installation takes the form of a rotating carousel that supports the multiplicity of treatment stations distributed around its perimeter. To give a specific case, one installation of this type currently commercialized by the Applicant is equipped with twenty treatment stations and the Applicant envisages commercializing an installation of greatly increased capacity, typically comprising around forty treatment stations, for which the provisions according to the invention are more particularly intended to be employed, although this is not the exclusive application.

In FIGS. 1 and 2, for the sake of simplification and clarity, only those parts of the installation that are useful for understanding the invention are shown. Thus, only one group of adjacent treatment stations of the installation in question together by the arrangements of the invention is shown, it being understood that all the other groups of treatment stations are arranged in identical fashion. In the example illustrated, it will be assumed that the installation comprises an even number of treatment stations and that each group of stations consists of two adjacent stations, as it is currently this configuration that proves to be simple to implement from the structural and functional standpoint, while still resulting in the desired functional simplifications, it being however understood that the arrangements of the invention may be perfectly transposed to groups of stations comprising a larger number of treatment stations than two.

Each treatment station 1 essentially comprises a treatment enclosure 2 and a cover 3 that includes a vacuum pumping chamber (not visible in the drawings) in which connection means 4 for sealed connection to the container 5 comprise a sleeve 6 of tubular general shape co-axial with the neck 7 of the container. Each cover 3 also supports an injector 8 co-axial with said sleeve 4 and suitable for injecting a reactive fluid into the container 5 during the execution of the process for treating said container so as to form a layer of barrier material on the inner surface of said container.

The treatment stations 1 are supported by a common frame, which, within the context of a machine having a large number of treatment stations, is a rotary frame of the carousel type on which the treatment stations are distributed circularly.

Document FR 2 872 148 describes and illustrates in detail an arrangement of such a treatment station.

However, it should be pointed out that the work station that is described and illustrated in said document is arranged in the manner that is conventional in the machines designed and produced hitherto by the Applicant, with a cover that can move with respect to the enclosure, above the latter, in order to allow the insertion of the containers into the enclosure, prior to their treatment, and their extraction from the enclosure once the treatment has been completed, this insertion and extraction taking place via the top of the enclosure. However, this architecture requires, in order to free up the space needed for passage of the containers, the cover and all the equipment that it supports (sleeve, injector and their support members in particular) and particularly the flexible tubing for connecting the various fluid sources (vacuum, reactive gas, etc.) to have to undergo, in the upper part of the machine, large movements. The repeated deformations of these flexible tubings require permanent monitoring and maintenance in order to avoid incidents during operation of the machine. In addition, to facilitate access to the members requiring regular maintenance or replacement, the structure of the cover and of the support members turns out to be complicated, with pivoting parts, locking means, sealing members, etc.

It is to remedy these drawbacks that the work stations shown in FIGS. 1 and 2 of the appended drawings are arranged differently, with the cover 3 designed in the form of a stationary upper block fastened to the enclosure 2 in such a way that the members supported by said block undergo no movement, the tubings may be replaced in many cases by channels machined in the block, and the remaining tubings (the tubing 9 for connecting the injector 8 to the block for example) are provided only for making it easier to remove and fit the injector under conditions that will be explained later and no longer undergo repeated deformations during operation of the machine.

This arrangement results in the containers being inserted or extracted from below the enclosure, with the use of a bottom 10 that can move vertically (in FIG. 1, the work stations 1 are shown in the position for loading/unloading the containers 5, the bottoms 10 being lowered). The other parts of the installation are neither structurally nor functionally directly relevant to the features of the invention and will not be described, although some of them are visible in FIGS. 1 and 2.

Figure 4:
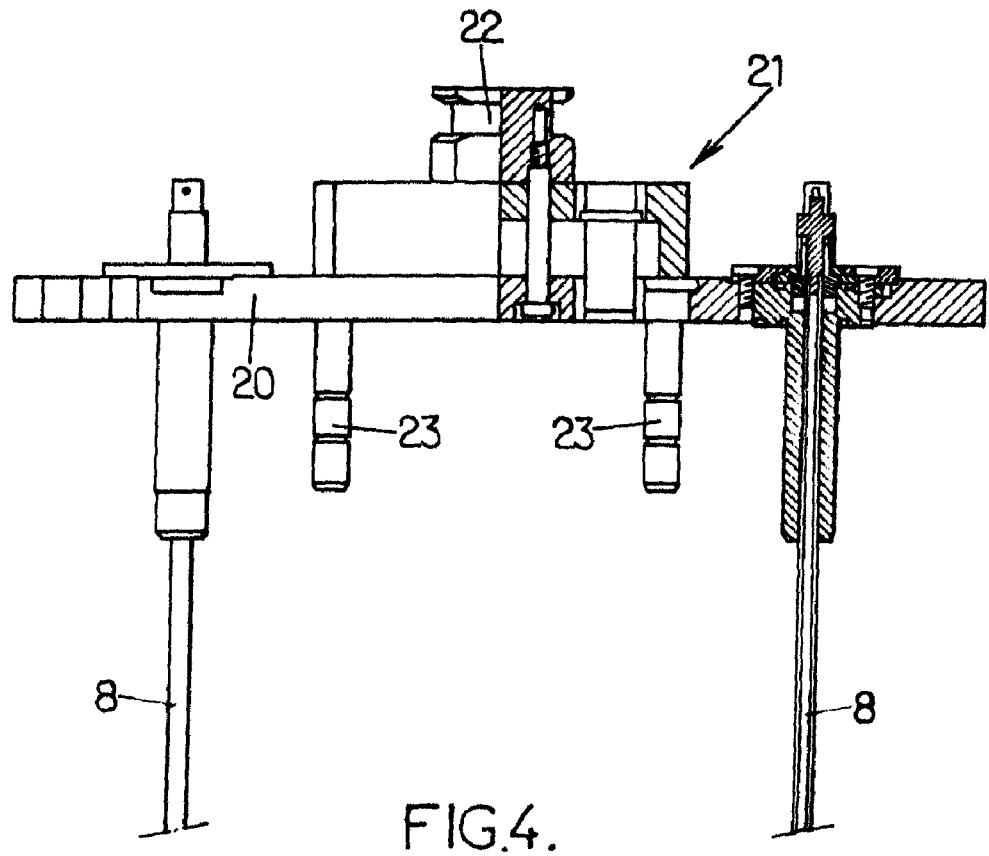

The features according to the invention will now be explained with reference not only to FIGS. 1 and 2, but also to FIGS. 3 and 4 on a larger scale.

The sleeves 6 of the two adjacent stations 1 constituting a group of treatment stations are fastened to a single sleeve-carrying plate 15 that extends as a bridge over the covers 3 of said stations. Thus, the sleeve-carrying plate 15 and the two sleeves 6 that are fastened to it constitute a unitary assembly 16 that can be maneuvered as one piece in order to fit said sleeves 6 onto the respective covers or to remove them therefrom. The time required for handling such an assembly 16 is reduced to almost half that required by the successive operations of individually handling two sleeves 6 taken in isolation.

Advantageously, the sleeve-carrying plate 15 includes, in its central part, a gripping means, such as a protruding stud 17, suitable for maneuvering the unitary assembly 16, especially using a gripping arm.

Also advantageously, guiding and optionally polarizing means are associated with the sleeve-carrying plate 15 and with the covers 3. In the exemplary embodiment illustrated, the sleeve-carrying plate 15 is provided with at least one guiding finger 18 substantially parallel to the axes of the sleeves 6, and the corresponding cover 3 is provided with at least one respective guiding housing 19 suitable for receiving said guiding finger 18. In this case, two fingers 18 are provided on the plate 15, a certain distance apart, and two respective guiding housings 19 in the covers 3.

A similar arrangement may be provided for the injectors 8. The injectors 8 of the two adjacent stations 1 constituting a group of treatment stations are fastened to a single injector-carrying plate 20 that extends as a bridge over the covers 3 of said stations. Thus, the injector-carrying plate 20 and the two injectors 8 that are fastened to it constitute a unitary assembly 21 that can be maneuvered as one piece in order to fit said injectors 8 onto the respective covers 3 or to remove them therefrom. As in the case of the sleeves 6, the time required for handling such an assembly 21 is reduced to almost half that required for the successive operations of individually handling two injectors 8 taken in isolation.

Advantageously, the injector-carrying plate 20 includes, in its central part, a gripping means, such as a protruding stud 22, suitable for maneuvering the unitary assembly 21, especially using a gripping arm.

Also advantageously, guiding and optionally polarizing means analogous to those mentioned above for the sleeve-carrying plate may be associated with the injector-carrying plate 20.

In practice, the sleeves 6 and the injectors 8 are simultaneously present in the stations 1. Therefore, it is necessary to superpose the two unitary assemblies 16, 21. The assembly 16 with the sleeves 6 is placed underneath in contact with the covers 3, whereas the assembly 21 with the injectors 8 is placed on top of the assembly 16, the injectors 8 being engaged coaxially in the sleeves 6.

Thus advantageously, the guiding and optionally polarizing means associated with the injector-carrying plate 20 may be arranged as shown in the exemplary embodiment illustrated: the injector-carrying plate 20 is provided with at least one guiding finger 23 substantially parallel to the axes of the injectors 8, and the corresponding subjacent sleeve-carrying plate 15 is provided with at least one respective guiding housing 25 (for example defined in a guiding ring 24 provided, as illustrated, on the sleeve-carrying plate) suitable for receiving said guiding finger 23. In this case, two fingers 23 are provided on the plate 20, a certain distance apart, and two respective guiding rings 24 in the sleeve-carrying plates 15.

Two orifices 34 are made in the cover 3, these being intended to let the guiding rings 24 of the sleeve-carrying plate 15 pass through them.

Furthermore, in their respective central parts, the sleeve-carrying plate 15 and the injector-carrying plate 20 are mutually offset in transversely opposed directions, as may be seen in FIG. 2, and the respective gripping means 17, 22 are located side by side.

Advantageously, when the injector-carrying plate 20 is placed on the sleeve-carrying plate 15, the means 17 for gripping the sleeve-carrying plate 15 allows the assembly comprising the two, injector-carrying and sleeve-carrying, plates to be handled as one piece.

Finally, as is visible in FIG. 1, each unitary assembly 16, 21 is designed for automatically establishing the necessary fluidic and/or electrical connections with the associated covers 3, such as the connections 26 (visible in FIG. 2) intended for supplying the injectors 8 (via tubings 9 that are flexible for the purpose of making it easier to dismantle the injectors).

To make the structure as simple as possible and to reduce the size of the sleeve-carrying plate 15 and injector-carrying plate 20, the enclosures 3 of the two adjacent stations 1 of a group of stations may advantageously be brought as close as possible to each other and juxtaposed, as clearly shown in FIGS. 1 and 2.

Thanks to the provisions according to the invention that have just been explained, the steps for replacing the sleeves 6 and the injectors 8 are simplified and in particular speeded up. In addition, owing to the configuration given to the unitary assemblies 16, 21, these operations of fitting and removing the unitary assemblies may be automated so that it is possible to envisage a process for the maintenance of the sleeves 6 and the injectors 8 that is entirely automated.

The above detailed description considered more particularly the practical situation consisting in providing an even number of treatment stations 1, in joining the treatment stations in groups of two adjacent stations and in ensuring that each plate 15, supports two members (sleeve 6; injector 8) belonging to the two respective adjacent treatment stations of a group of stations. However, it will be understood that that provisions of the invention may be applicable when the treatment stations are distributed in groups comprising any number of adjacent treatment stations, each plate then supporting several members belonging to the respective adjacent stations of a group of stations.

What is claimed is:

1. Installation for depositing, by means of a microwave plasma, a barrier coating on the internal surface of containers each comprising a neck and a body and made of a thermoplastic comprising PET, the installation comprising:

a multiplicity of container treatment stations each comprising a treatment enclosure;

bottoms which each supports a corresponding container and which move axially to insert and extract the container, placed neck up, into and from the treatment enclosure, via a base of the treatment disclosure; and an upper block forming a cover which comprises an upper surface and a lower surface disposed on a top of the treatment enclosure proximate the necks of the containers so that the microwave plasma is injected via the cover toward the necks of the containers, the upper block including:

a vacuum pumping chamber in which connection means for sealed connection to the neck of the container comprises a sleeve of tubular general shape coaxial with the neck of the container, each cover supporting an injector coaxial with said sleeve for injecting a reactive fluid into the container during the treatment, wherein members, chosen from among the sleeves and the injectors of several adjacent stations forming a group of stations are fastened to a single support plate that extends as a bridge over upper surfaces of the covers of said adjacent stations, said plate and the members of said adjacent stations of the group of stations constitute a unitary assembly that is maneuvered as one piece to fit said members onto the covers of respective adjacent stations or to remove the members therefrom.

2. Installation according to claim 1, wherein the members are sleeves which comprise protruding members fastened to a single sleeve carrying plate that extends as a bridge over the upper surfaces of the covers of said adjacent stations.

3. Installation according to claim 2, wherein the members further comprise injectors which are fastened to a single injector carrying plate that extends as a bridge over the covers of said stations;

injector carrying plate is located on a top of the sleeve carrying plate.

4. Installation according to claim 3, wherein each of the injector carrying plate and the sleeve carrying plate includes, in a respective central part, a respective gripping means for maneuvering the unitary assembly, the respective central parts of the sleeve carrying plate and the injector carrying plate are mutually offset in transversely opposed directions, the respective gripping means are located side by side, and the means for gripping disposed on the sleeve carrying plate, located beneath the injector carrying plate, allows the unitary assembly comprising the sleeve carrying plate and the injector carrying plate to be handled as one piece.

5. Installation according to claim 3, wherein each plate is provided with at least one guiding finger which is substantially parallel to the axes of the members supported by said plate and which is received in the element subjacent to said plate, and the sleeve carrying plate located beneath the injector carrying plate is provided with at least one through housing suitable for the at least one guiding finger of the injector carrying plate to pass through the housing.

6. Installation according to claim 1, wherein the members are injectors which are fastened to a single injector carrying plate that extends as a bridge over the upper surfaces of the covers of said adjacent stations.

7. Installation according to claim 1, wherein each plate includes, in a central part, a gripping means for maneuvering the unitary assembly.

8. Installation according to claim 1, wherein each unitary assembly is designed for automatically establishing at least one of fluidic and electrical connections with associated covers.

9. Installation according to claim 1, wherein each plate is provided with at least one guiding finger which is substantially parallel to the axes of the members supported by said plate and which is received in the element subjacent to said plate.

10. Installation according to claim 1, wherein the treatment stations are distributed in groups comprising several adjacent stations and wherein each plate supports several members belonging to the respective adjacent stations of a group of stations.

11. Installation according to claim 10, comprising an even number of stations, wherein each group of stations comprises two adjacent stations and wherein each plate supports several members belonging to the two respective adjacent stations of a group of stations.

12. Installation according to claim 11, wherein the treatment enclosures of the two adjacent stations of a group of stations are brought together and juxtaposed.

13. Installation according to claim 1, wherein, for each station, the upper block forming the cover is stationary and fastened to a respective treatment enclosure.

14. Installation according to claim 1, comprising:

a rotating carousel including a rotary frame that supports said multiplicity of stations distributed on the perimeter thereof.

* * * * *